(12) United States Patent
Bhandari

(10) Patent No.: US 7,776,408 B2
(45) Date of Patent: Aug. 17, 2010

(54) METHOD AND APPARATUS FOR PRODUCING SINGLE CRYSTALLINE DIAMONDS

(76) Inventor: Rajneesh Bhandari, S 271 Mahaveer Nagar, Jaipur - 302018 (IN)

( * ) Notice: Subject to any disclaimer, the term of this patent is extended or adjusted under 35 U.S.C. 154(b) by 703 days.

(21) Appl. No.: 11/705,980

(22) Filed: Feb. 14, 2007

(65) Prior Publication Data

US 2008/0190356 A1 Aug. 14, 2008

(51) Int. Cl.
*H05H 1/46* (2006.01)
*H05H 1/24* (2006.01)
*C23C 16/00* (2006.01)

(52) U.S. Cl. ............... 427/575; 427/569; 118/723 MW; 156/345.41

(58) Field of Classification Search ................. 427/575, 427/569; 118/723 MW; 156/345.41
See application file for complete search history.

(56) References Cited

U.S. PATENT DOCUMENTS

| | | | |
|---|---|---|---|
| 5,370,912 A | 12/1994 | Bigelow et al. | |
| 5,387,288 A | * 2/1995 | Shatas | 118/723 AN |
| 6,858,078 B2 | 2/2005 | Hemley et al. | |
| 2006/0110546 A1 | * 5/2006 | Vikharev et al. | 427/575 |

* cited by examiner

*Primary Examiner*—Timothy H Meeks
*Assistant Examiner*—Collette Ripple
(74) *Attorney, Agent, or Firm*—William L. Botjer

(57) ABSTRACT

A method and an apparatus for producing one or more single crystalline diamonds. One or more diamond seeds are placed in a substrate holder in a chemical vapor deposition (CVD) chamber. One or more metal discs are then positioned in the chemical vapor deposition chamber such that high temperature is generated at low microwave power. A diamond forming gas is then provided adjacent to the one or more diamond seeds. Plasma is then generated from the diamond forming gas by exposing the diamond forming gas to microwave radiation. The one or more diamond seeds are then exposed to the plasma under certain conditions to form single crystalline diamonds. The position of the plasma is manipulated to provide uniform growth conditions at the growth surface of the one or more diamond seeds.

15 Claims, 7 Drawing Sheets

METHOD AND APPARATUS FOR PRODUCING SINGLE CRYSTALLINE DIAMONDS

BACKGROUND

The invention relates to a method and an apparatus for producing single crystalline diamonds by Microwave Plasma Chemical Vapor Deposition (MPCVD) process. More specifically, it describes a method and an apparatus for producing one or more single crystalline diamonds at a high growth rate by generating high substrate temperatures at low microwave power.

Diamonds are crystalline allotropes of carbon. They are renowned for their superlative physical qualities, especially their hardness and their high dispersion of light. These properties make diamonds valued for use in jewelry and a variety of industrial applications. A natural diamond is formed naturally in the earth due to the prolonged exposure of carbon-bearing materials to high pressure and temperature. Scientists have been able to produce synthetic diamonds under laboratory conditions, which have similar chemical composition and physical properties as natural diamonds.

Deposition of polycrystalline diamond films first attracted the attention of scientists after it was discovered that when a mixture of methane and hydrogen gases is subjected to a Chemical Vapor Deposition (CVD) process, atomic hydrogen prevents the formation of energetically favorable graphite. Research in the field of diamond production got a further impetus with the development of an efficient way of generating atomic hydrogen in a mixture of methane and hydrogen when plasma is created at a microwave frequency of 2.45 GHz. Subsequently, various CVD methods such as hot filament, radio-frequency plasma and arc-jet torch have been used to deposit diamond films using the same principle.

However, the diamond films produced by the above-mentioned methods are polycrystalline in nature and growth rates are typically between 0.5-3 microns per hour. Moreover, the polycrystalline diamond films have a large concentration of grain boundaries that deteriorate the properties of the micron-sized crystallites present in these films. As a result, these films have very limited applications.

Single crystalline diamonds are used as a potential material for fabricating high pressure anvils, electronic devices, optical windows, and heat sink applications, etc. Consequently, producing single crystalline diamonds has become increasingly important. Some of the important parameters for producing single crystalline diamonds using CVD method are: substrate temperature, deposition pressure and microwave power.

U.S. Pat. No. 5,370,912, titled 'Diamond Film Deposition with a Microwave Plasma', describes a method for depositing a diamond film using a microwave plasma generating apparatus that includes a tunable microwave cavity. The microwave cavity is tuned by adjusting its height and the depth of the insertion of an antenna. The height of the cavity and the depth of the insertion of the antenna are continuously adjusted to minimize the reflected radiation and vary the shape and position of the plasma. The method involves heating the diamond substrate to about 950° C. to 1,100° C., and creating a plasma, including hydrogen gas, within the deposition chamber at a pressure of at least about 30 torr. Further, the method involves monitoring the plasma to ensure its proper position, and maintaining the plasma for a sufficient time to deposit the desired thickness of the diamond film. However, the diamond films deposited by this method are poly-crystalline in nature.

U.S. Pat. No. 6,858,078, titled 'Apparatus and Method for Diamond Production', describes an apparatus and a method for growing a single crystalline diamond by the MPCVD process. The method for producing the single crystalline diamond involves positioning a diamond in a heat-sinking holder such that a thermal contact is made with a side surface of the diamond adjacent to an edge of a growth surface of the diamond. The temperature of the growth surface of the diamond is measured to generate temperature measurements using a non-contact temperature measurement device. Moreover, the method involves controlling temperature of the growth surface, based upon the temperature measurements.

However, the methods and apparatus described above have limitations with respect to generating high substrate temperature in the CVD chamber at low microwave power for producing diamonds. As high substrate temperature is essential for the growth of single crystalline diamonds, a power source of higher microwave power is required. This decreases the efficiency of the method for producing single crystalline diamonds.

In light of the foregoing discussion, there is a need for a method and an apparatus for producing single crystalline diamonds that can generate high substrate temperature at low microwave power. Further, the method and the apparatus should be able to achieve high growth rate while producing single crystalline diamonds. Furthermore, there is a need for a method and an apparatus that maintains uniform growth conditions at the growth surface of substrates when multiple single crystalline diamonds are to be produced.

SUMMARY

An object of the invention is to provide a method and an apparatus for producing one or more single crystalline diamonds at a high growth rate.

Another object of the invention is to generate high temperature at a low microwave power.

Yet another object of the invention is to provide uniform growth conditions at the growth surface of the one or more diamond seeds by manipulating the position of the plasma.

Yet another object of the invention is to provide metal discs in a Chemical Vapor Deposition (CVD) chamber that are positioned to reflect the microwave radiation for sustaining the high-density plasma.

To achieve the above-mentioned objectives, the invention provides a method and an apparatus for producing one or more single crystalline diamonds. According to the method of the invention, one or more diamond seeds are placed in a substrate holder in a CVD chamber. One or more metal discs are then placed in the CVD chamber in such a manner that high temperature is generated at low microwave power. A diamond forming gas, essentially containing hydrogen and methane, is then introduced inside the CVD chamber adjacent to the one or more diamond seeds. The diamond forming gas is exposed to microwave radiation for generating plasma under conditions to facilitate the production of one or more single crystalline diamonds. The method further involves manipulating the position of the plasma to provide uniform growth conditions on the growth surface of the one or more diamond seeds.

The method and the apparatus of the invention thus enable the production of one or more single crystalline diamonds at a high growth rate. Further, the method and the apparatus enable generation of high temperatures at the one or more diamond seeds at low microwave power. Additionally, the method and the apparatus of the invention result in maintaining uniform growth conditions at the surface of the one or more diamond seeds inside the CVD chamber.

BRIEF DESCRIPTION OF THE DRAWINGS

Various embodiments of the invention will hereinafter be described in conjunction with the appended drawings provided to illustrate and not to limit the invention, wherein like designations denote like elements, and in which.

DESCRIPTION OF VARIOUS EMBODIMENTS

For the sake of convenience, the terms used to describe various embodiments are described below. It should be understood that these are provided to merely aid the understanding of the description, and that definitions in no way limit the scope of the invention.

Natural diamond: A diamond formed within the earth due to the prolonged exposure of carbon-bearing materials to high pressure and temperature.

Synthetic diamond: A man-made diamond with all the physical and chemical properties of natural diamond.

Single crystalline: An arrangement of the atoms of an element or a compound that have long range ordering and translational symmetry.

Polycrystalline: A material made of several smaller crystallites of micron sizes.

Chemical vapor deposition (CVD): A process for depositing films of various materials including diamond near or below atmospheric pressure. In a typical CVD process, the substrate is exposed to one or more volatile/non-volatile precursors, which react and/or decompose on the substrate's surface to produce the desired deposit. During the process, volatile by-products are also produced frequently, which are removed by a gas flowing through the reaction chamber.

High Pressure High Temperature (HPHT): A process in which a diamond is crystallized from carbon, in the presence of a metal catalyst, at pressures of about 50-100 kbar and at temperatures of about 1800-2300K.

Microwave: Microwaves are electromagnetic radiation with frequencies in the range of 300 MHz to 300 GHz. Electromagnetic radiation comprises electric and magnetic fields perpendicular to each other. Microwaves in the range of 2.45 GHz to 30 GHz frequencies are commonly used for scientific and industrial purposes.

Microwave Cavity: A microwave cavity confines the microwave radiations within the cavity.

Plasma: Plasma is a hot/cold ionized gas comprising ions, electrons, etc.

Diamond Seed: A diamond seed is the raw material on the surface of which diamond growth takes place.

Substrate Holder: A device that holds the diamond substrate inside a CVD chamber.

Spectroscopy: Spectroscopy is the study of the physical quantities of matter by analyzing the frequency of light emitted by the matter. Various physical quantities, such as the intensity of light, the amplitude of vibrations, the kinetic energy of matter particles and so forth, may be measured to study the structure of matter.

Raman Spectroscopy: Raman spectroscopy is a technique that measures certain physical properties by measuring the amount of light that a substance scatters at certain wavelengths.

Various embodiments of the invention provide a method for producing one or more single crystalline diamonds by the Microwave Plasma Chemical Vapor Deposition (MPCVD) process. The method involves producing one or more single crystalline diamonds at high growth rates at a low microwave power.

Figure 1:
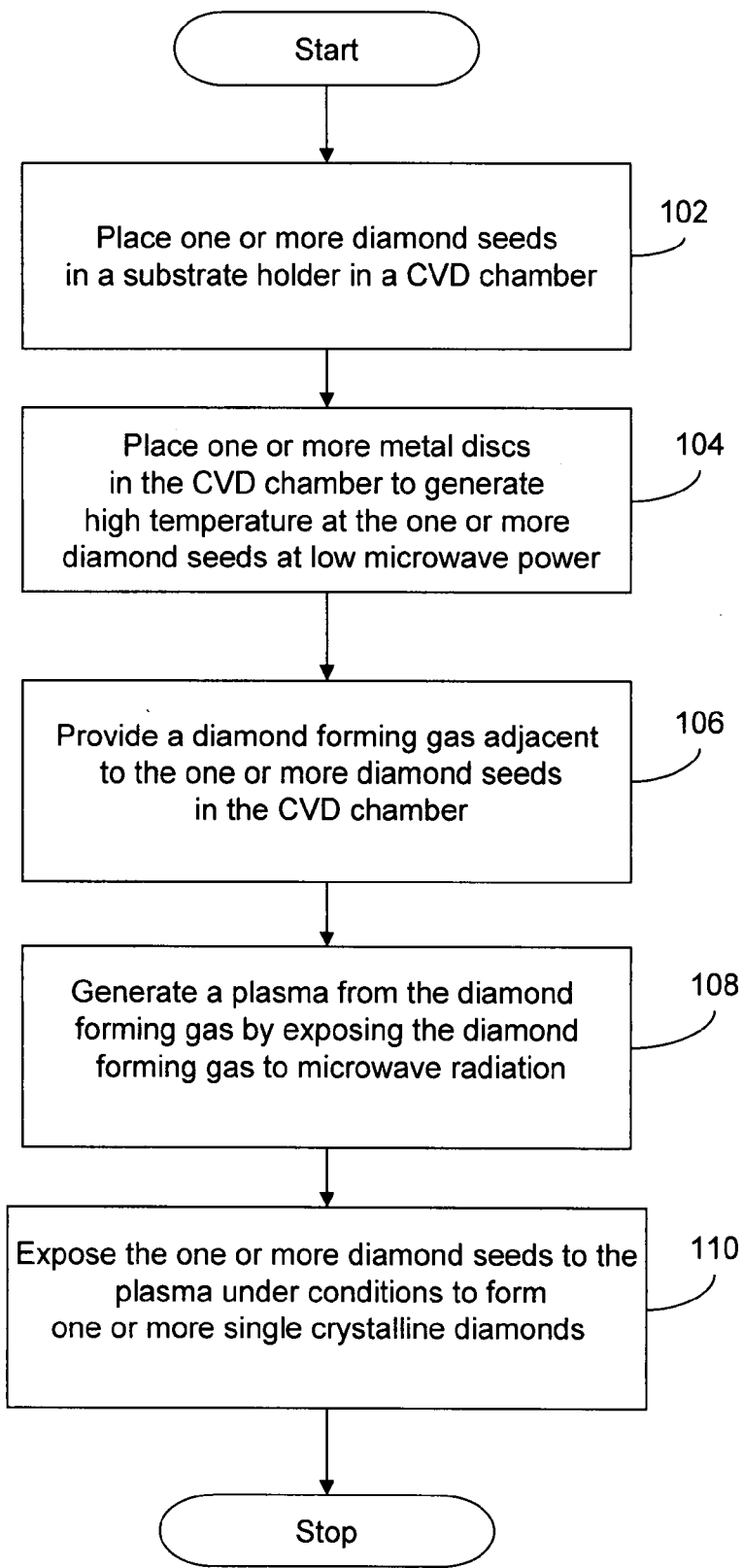
FIG. 1 is a flowchart illustrating a method for producing one or more single crystalline diamonds, in accordance with an embodiment of the invention.

FIG. 1 is a flowchart illustrating a method for producing one or more single crystalline diamonds, in accordance with an embodiment of the invention.

At step 102, one or more diamond seeds are placed in a substrate holder in a Chemical Vapor Deposition (CVD) chamber: In accordance with an embodiment of the invention, the CVD chamber is a stainless steel chamber with a diameter of 16 centimeters (cms) and a height of 21 cms. The CVD chamber is a pressure-sealed equipment, which is maintained in a pressure range of 90 torr to 300 torr. However, it will be apparent to a person skilled in the art that the CVD chamber can be modified according to the need of the invention.

The diamond seed is the raw material on the surface of which diamond growth takes place. Examples of diamond seed include, but are not limited to, natural diamond, synthetic diamond, single crystalline diamond, colorless diamond, and colored diamond. Examples of synthetic diamond include, but are not limited to, CVD-grown synthetic diamond, and High Pressure High Temperature (HPHT)-grown synthetic diamond.

In accordance with an embodiment of the invention, the substrate holder is a Molybdenum disc. A Molybdenum disc of 30 mm is used as the substrate holder. The Molybdenum disc is placed on a stainless steel plate with a diameter of 15 cms and of a thickness of 5-6 mm. The stainless steel plate is attached to a moving assembly that can be moved upward or downward. The upward or downward movement of the moving assembly can change the dimensions of a microwave cavity to tune the frequency of microwave radiation. The substrate holder can also be made from other suitable materials such as hexagonal boron nitride, hexagonal boron nitride previously coated with diamond, silicon nitride, molybdenum, and so forth.

At step 104, one or more metal discs are placed in the CVD chamber to generate a high temperature at the one or more diamond seeds at low microwave power. In accordance with one embodiment of the invention, the one or more metal discs are made of stainless steel. In accordance with another embodiment of the invention, the one or more metal discs can be made of molybdenum, or other suitable metals or metal compounds. The metal discs reflect the microwave radiation, thereby generating high temperature at the surface of the one or more diamond seeds in the substrate holder. The metal discs are placed in the same plane as the substrate holder.

In accordance with an embodiment of the invention, there are four metal discs placed in the same plane as the substrate holder in the CVD chamber. This is explained in conjunction with FIG. 3. In accordance with another embodiment of the invention, two metal discs are placed in the same plane as the substrate holder in the CVD chamber. This is explained in conjunction with FIG. 4. However, it will be apparent to a person skilled in the art that the number of metal discs and their position in the CVD chamber can vary, according to the required temperature that has to be generated at the surface of the one or more diamond seeds. In accordance with an embodiment of the invention, micro-positioners are used for adjusting the position of the one or more metal discs with respect to a central axis of the CVD chamber.

At step 106, a diamond forming gas is provided adjacent to the one or more diamond seeds in the CVD chamber. In accordance with an embodiment of the invention, the CVD chamber includes Mass Flow Controllers (MFCs) for providing a diamond forming gas adjacent to the one or more diamond seeds. The diamond forming gas contains a carbon containing substance and a carrier gas. The carbon containing substance is a hydrocarbon with number of carbon atoms less than 6. In accordance with an embodiment of the invention, the carbon containing substance is methane, and the carrier substance is hydrogen. In accordance with one embodiment of the invention, the ratio of methane to hydrogen is maintained between 4 to 24 percent of hydrogen. However, the invention should not be construed to be limited only to the use of methane as the carbon containing substance. Other carbon containing substances such as acetylene, ethylene, propane, etc., can also be used without deviating from the scope of the invention. It will be apparent to a person skilled in the art that the carrier substance has a significant role in facilitating diamond growth and serves purposes such as stabilizing the substrates surfaces, dissolving the carbon in the gas, and generating condensable carbon radicals.

At step 108, plasma is generated from the diamond-forming gas by exposing the diamond-forming gas to microwave radiation. Microwave radiation is fed into the CVD chamber through a rectangular to a circular mode converter. In accordance with an embodiment of the invention, a microwave generator generates the microwave radiation to form plasma from the diamond forming gas.

At step 110, the one or more diamond seeds are exposed to the plasma under conditions to form the one or more single crystalline diamonds. The generated plasma raises the temperature at the one or more diamond seeds, which facilitates the deposition of carbon onto the surface of the diamond seed. In accordance with one embodiment of the invention, the diamond growth takes place on the growth surface of the one or more diamond seeds. In accordance with an embodiment of the invention, the temperature generated at the diamond seed is 1250° C. for a microwave power of 1350 W, which is equivalent to an efficiency of about 1° C./Watt.

The microwave power and the pressure in the CVD chamber are maintained for the entire duration of the deposition. In accordance with an embodiment of the invention, after about 10 hours of the deposition process, the diamond seed is removed. Various characterization studies, such as the Raman spectroscopy, X-ray diffraction and thermal conductivity measurements are carried out on the single crystalline diamonds produced.

As the growth on the one or more diamond seeds in the substrate holder becomes thicker, the growth gets immersed in the plasma and the conditions at the growth surface change with the passage of time. This may lead to non-uniform growth of the one or more single crystalline diamonds. However, it will be apparent to a person skilled in the art that the uniform growth rate can be maintained for producing single crystalline diamonds by lowering the diamond seed at the same rate as the growth rate of the diamond. However, this uniform growth rate cannot be maintained when multiple pieces of single crystalline diamonds are to be produced. Therefore, in accordance with an embodiment of the invention, the position of the plasma is manipulated to provide uniform growth conditions at the growth surface of the diamond.

In accordance with an embodiment of the invention, the position of the plasma is manipulated inside the CVD chamber to provide uniform growth conditions at the growth surface of the one or more diamond seeds. Manipulating the position of the plasma helps in maintaining the growing diamond seed in the same position inside the plasma. The movement of the plasma provides control over the temperature at the one or more diamond seeds and the plasma density, thereby providing control over the growth of the diamond. The manipulation of the position of the plasma is further explained in conjunction with FIG. 2:

It will be apparent to a person skilled in the art that the present invention is capable of using multiple diamond seeds for producing multiple pieces of single crystalline diamonds.

Figure 2:
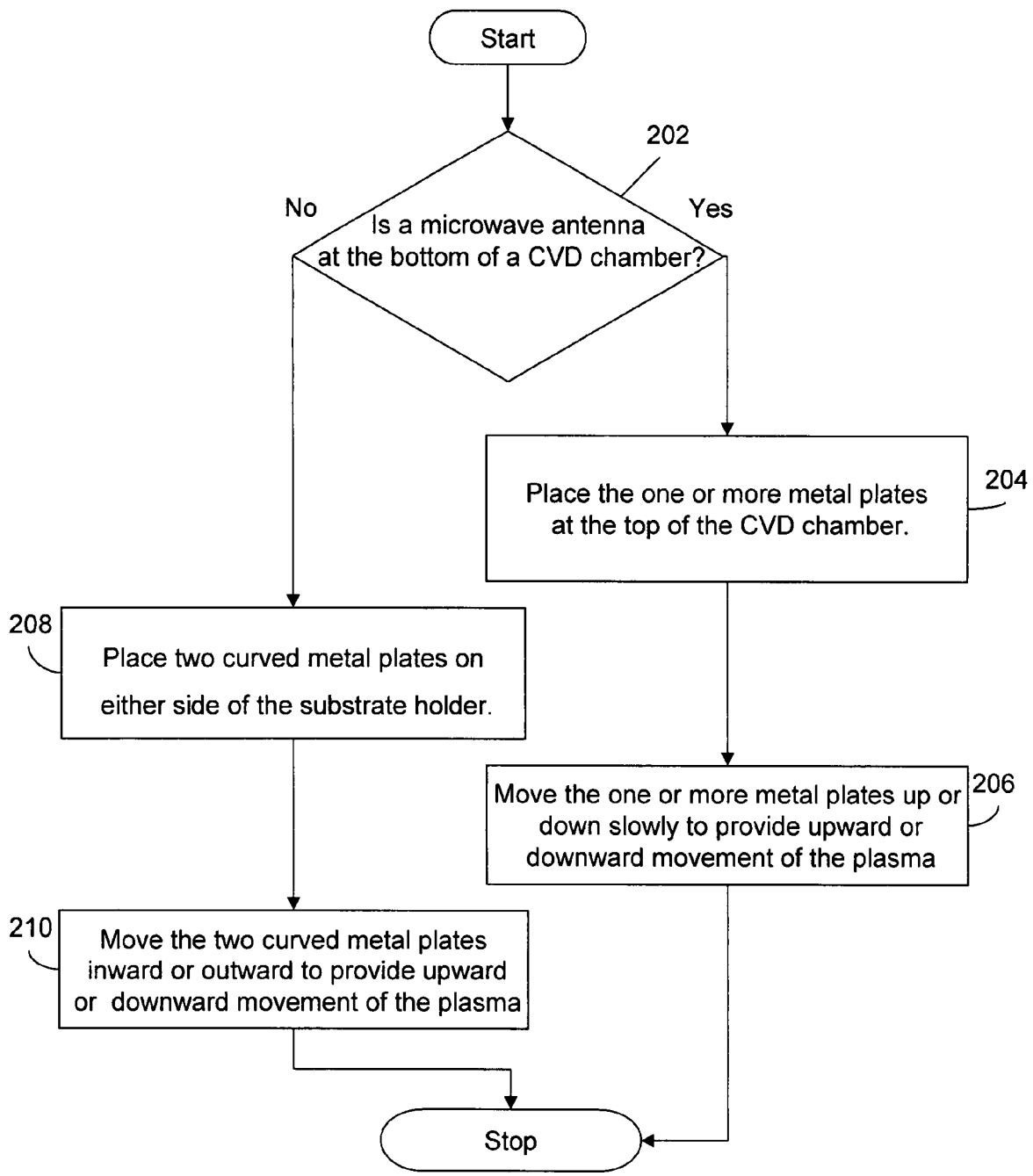
FIG. 2 is a flowchart illustrating a method for manipulating the position of plasma in a Chemical Vapor Deposition (CVD) chamber, in accordance with an embodiment of the invention.

FIG. 2 is a flowchart illustrating a method for manipulating the position of plasma in the CVD chamber, in accordance with an embodiment of the invention.

At step 202, it is checked whether a microwave antenna is present at the bottom of the CVD chamber. If yes, then at step 204, one or more metal plates are placed at the top of the CVD chamber. Thereafter, at step 206, the one or more metal plates are slowly moved upward or downward to manipulate the position of the plasma. The motion of the one or more metal plates is facilitated by micro-positioners that are attached to the CVD chamber through a vacuum feedthrough. The upward or downward movement of the one or more metal plates with respect to the one or more diamond seeds provides upward or downward movement of the plasma, which provides uniform growth conditions on the growth surface of the one or more diamond seeds in the substrate holder.

However, if the microwave antenna is at the top of the CVD chamber, then, at step 208, two curved metal plates are placed on either side of the substrate holder. Thereafter, at step 210, the two curved metal plates are moved inward or outward to manipulate the position of plasma. The inward or outward movement of the curved metal plates results in upward or downward movement of the plasma such that uniform growth conditions are provided on the growth surface of the one or more diamond seeds in the substrate holder. The motion of the two curved metal plates is facilitated by the micro-positioners that are attached to the CVD chamber through the vacuum feedthrough.

FIG. 2 has been explained considering the position of the microwave antenna at the top or bottom of the CVD chamber. However, it will be apparent to one skilled in the art that the position of the microwave antenna is not restricted to only the two exemplified positions in the CVD chamber.

Figure 3B:
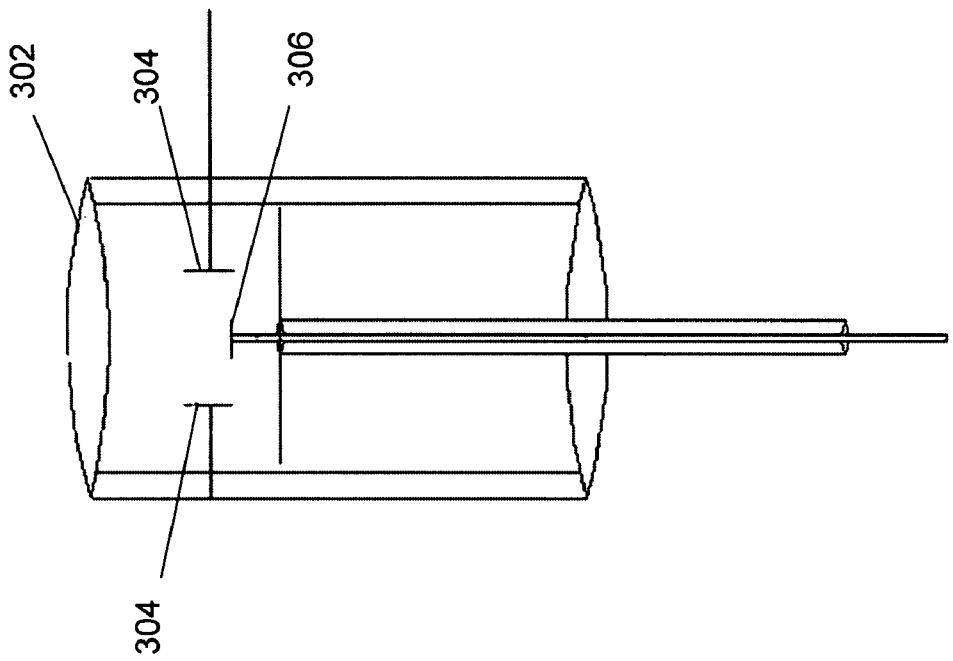
FIG. 3 is a schematic diagram illustrating two different views of curved metal plates used for manipulating the position of plasma in a CVD chamber, in accordance with an embodiment of the invention.
Figure 3A:
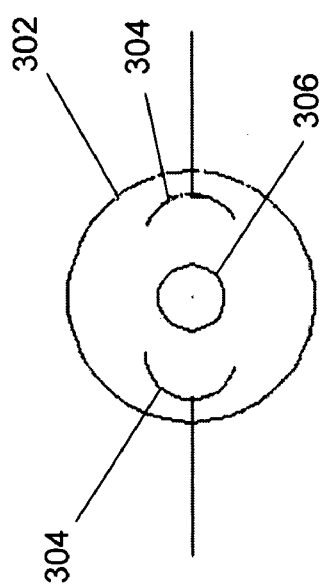

FIG. 3 is a schematic diagram illustrating two different views of curved metal plates used for manipulating the position of plasma in a CVD chamber, in accordance with an embodiment of the invention. FIG. 3a illustrates a top view of curved metal plates used for manipulating the position of plasma in a CVD chamber, in accordance with an embodiment of the invention. FIG. 3b illustrates a front view of curved metal plates used for manipulating the position of plasma in a CVD chamber, in accordance with an embodiment of the invention. As illustrated in FIG. 3a and 3b, a CVD chamber 302 includes two curved metal plates 304, and a substrate holder 306. CVD chamber 302 contains substrate holder 306, which holds one or more diamond seeds. Curved metal plates 304 are placed in the same plane as substrate holder 306. The position of the plasma is manipulated by placing curved metal plates 304 on either side of substrate holder 306 if the microwave energy is fed from the top of the CVD chamber. The inward or outward movement of curved metal plates 304 provides upward or downward movement of the plasma, which provides uniform growth conditions on the growth surface of the diamond seeds in substrate holder 306.

Figure 4:
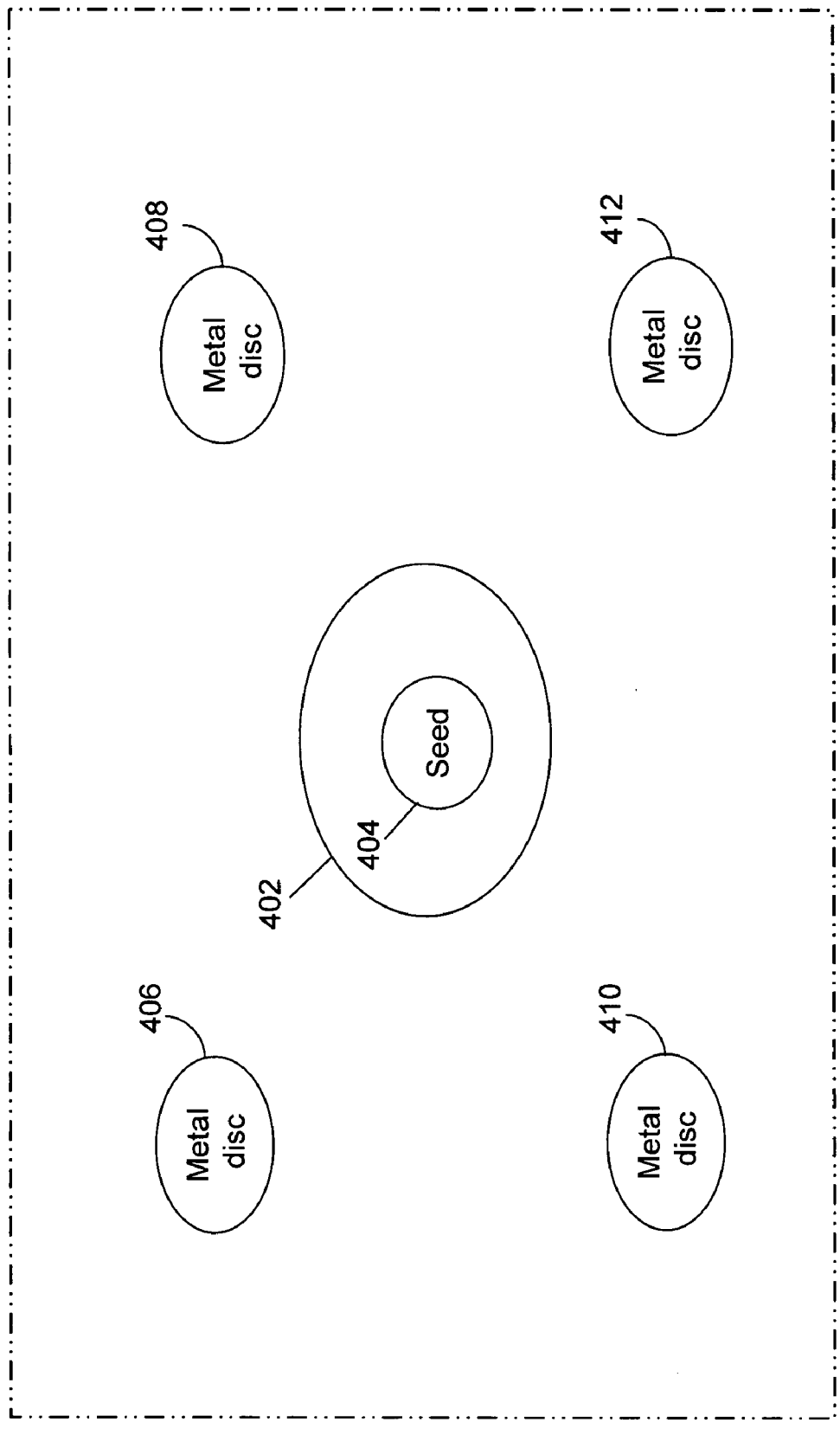
FIG. 4 is a schematic diagram illustrating an assembly of four metal discs surrounding a substrate holder in a CVD chamber, in accordance with an embodiment of the invention.

FIG. 4 is a schematic diagram illustrating an assembly of four metal discs surrounding a substrate holder in a CVD chamber, in accordance with an embodiment of the invention. As illustrated in FIG. 4, a CVD chamber 400 includes a substrate holder 402, a diamond seed 404, and a plurality of metal discs 406, 408, 410, and 412.

Substrate holder 402 is a Molybdenum disc. However, the invention should not be construed to be limited to the use of only Molybdenum disc as substrate holder 402. Substrate holder 402 can also be made of any other suitable material such as stainless steel, graphite, and so forth. Diamond seed 404 is located at the center of substrate holder 402. Examples of diamond seed 404 include CVD-grown synthetic diamond, and HPHT-grown synthetic diamond.

In accordance with an embodiment of the invention, four metal discs 406, 408, 410, and 412 of diameter 30 mm and thickness 10 mm are placed around substrate holder 402. Metal discs 406, 408, 410, and 412 are made of stainless steel. However, the invention should not be construed to be limited to the use of only stainless steel for metal discs 406, 408, 410, and 412. Metal discs 406, 408, 410, and 412 can be made of any other suitable material such as molybdenum and other metals and metal compounds. Metal discs 406, 408, 410, and 412 are positioned in such a manner that the double maxima in the electric field in the CVD chamber are converted to a single maximum. This leads to the formation of ellipsoidal intense plasma of microwave energy in CVD chamber 400.

For the deposition of a single crystalline diamond in CVD chamber 400, the flow of the precursor gases methane and hydrogen is maintained in CVD chamber 400 at a ratio of 4% to 24% of hydrogen. Initially, the plasma of hydrogen gas is formed at a pressure of 120 mbarr with the distances between metal discs 406 and 408 being 6 cms. Metal discs 410 and 412 are at a similar distance of 6 cms from each other. Once the pressure in CVD chamber 400 is stabilized at 120 mbarr, the temperature is measured at diamond seed 404 using a pyrometer.

In accordance with an embodiment of the invention, the distance between metal discs 406, 408, 410 and 412 is optimized. The microwave power is kept constant at 1000 watts. The distance between metal discs 406 and 412 is kept at 6 cms. The distance between metal discs 408 and 410 is optimized by moving metal discs 408 and 410 using external means such as micro-positioners. The micro-positioners are attached to CVD chamber 400 with the help of the vacuum feedthrough. The temperature at diamond seed 404 in substrate holder 402 is continuously monitored using a pyrometer. The position of metal discs 410 and 412 is fixed once the temperature on diamond seed 404 reaches a maximum value. Thereafter, the distance between metal discs 406 and 412 is optimized, under the same conditions, in a similar manner as the one used for metal discs 408 and 410. Once the maximum temperature is attained at the surface of diamond seed 404, the position of metal discs 406, 408, 410 and 412 is not changed.

Figure 5:
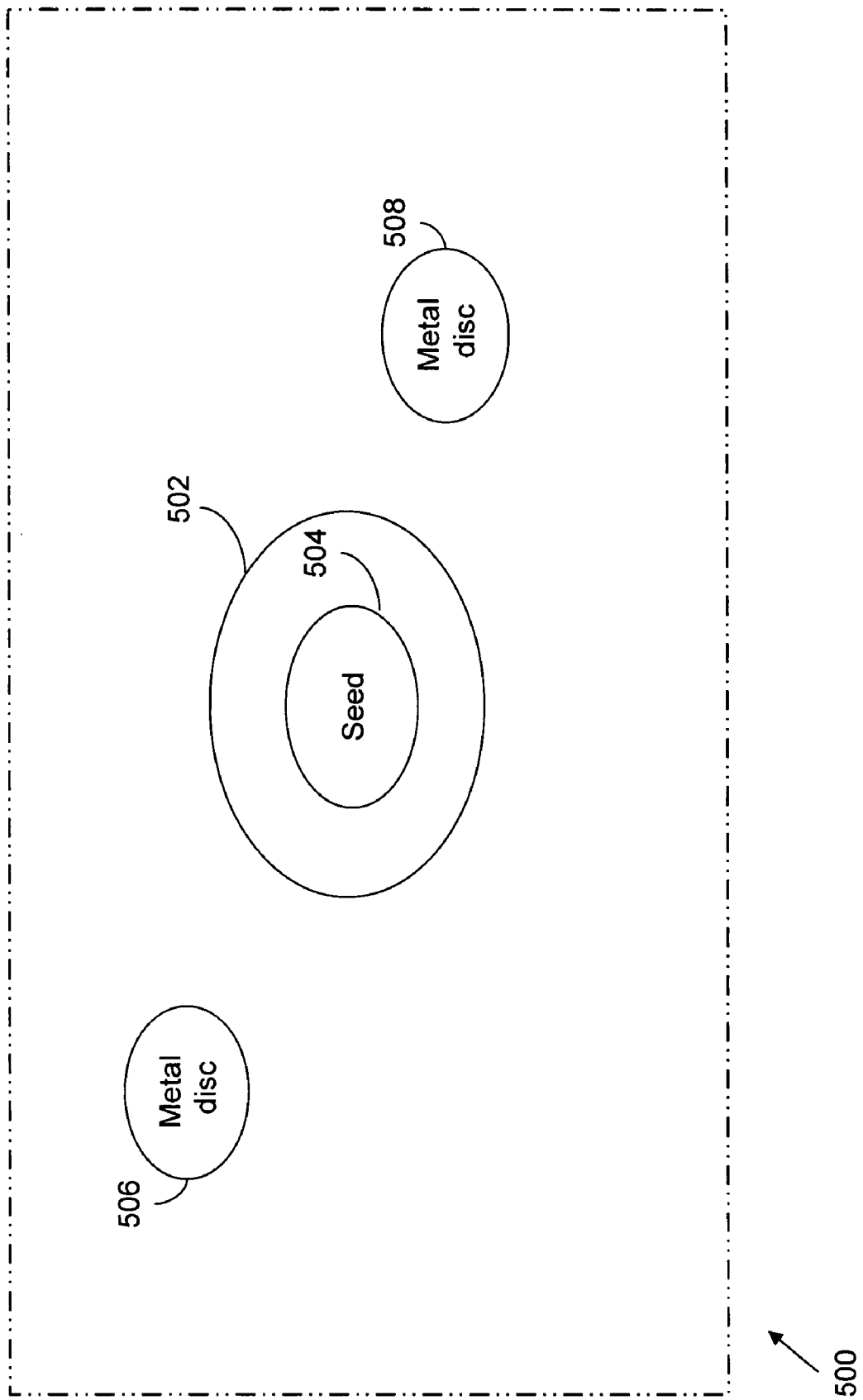
FIG. 5 is a schematic diagram illustrating an assembly of two metal discs surrounding a substrate holder in a CVD chamber, in accordance with another embodiment of the invention.

FIG. 5 is a schematic diagram illustrating an assembly of two metal discs surrounding a substrate holder in a CVD chamber, in accordance with an embodiment of the invention. As illustrated in FIG. 5, a CVD chamber 500 includes a substrate holder 502, a diamond seed 504, and a plurality of metal discs 506 and 508. It will be apparent to a person skilled in the art that the embodiment illustrated in FIG. 4 includes four metal discs around the substrate holder in the CVD chamber, whereas the embodiment illustrated in FIG. 5 includes two metal discs around the substrate holder in the CVD chamber.

Substrate holder 502 is a Molybdenum disc. Diamond seed 504 is located at the center of substrate holder 502.

In accordance with an embodiment of the invention, two metal discs 506 and 508 of diameter 30 mm and thickness 10 mm are placed around substrate holder 502. Metal discs 506 and 508 are made of stainless steel. However, the invention should not be construed to be limited to the use of only stainless steel for metal discs 506 and 508. Metal discs 506 and 508 can be made of any other suitable material such as molybdenum and other metals and metal compounds. Metal discs 506 and 508 are positioned in such a manner that the double maxima in the electric field inside CVD chamber are converted to a single maximum. This leads to the formation of intense ellipsoidal plasma of microwave energy in CVD chamber 500.

For the deposition of single crystalline diamond in CVD chamber 500, the ratio of methane to hydrogen is maintained between 4 to 24 percent of hydrogen. Initially, the plasma of hydrogen gas is formed at a pressure of 120 mbarr with the distances between metal disc 506 and substrate holder 502 being 6 cms. Metal disc 508 is at a similar distance of 6 cms from substrate holder 502. It will be apparent to a person skilled in the art that metal discs 506 and 508, and substrate holder 502 are in a parallel plane, however, metal discs 506 and 508 and diamond seed 504 need not be in the same plane. Once the pressure in CVD chamber 500 is stabilized at 120 mbarr, the temperature is measured at diamond seed 504 using a pyrometer. In accordance with an embodiment of the invention, the distance between metal discs 506 and 508 is optimized. The microwave power is kept constant at 1000 watts. The distance between metal disc 506 and substrate holder 502 is kept at 6 cms. The distance between metal disc 508 and substrate holder 502 is optimized using external means such as micro-positioners. The micro-positioners are attached to CVD chamber 500 with the help of the vacuum feedthrough. The temperature at diamond seed 504 in substrate holder 502 is continuously monitored using a pyrometer. The position of metal disc 506 is fixed once the temperature on diamond seed 504 reaches a maximum value. Thereafter, the distance between metal disc 508 and substrate holder 502 is optimized, under the same conditions, in a similar fashion (as for metal disc 506). Once the required maximum temperature is attained at the surface of diamond seed 504, the position of metal discs 506 and 508 is not changed.

Figure 6:
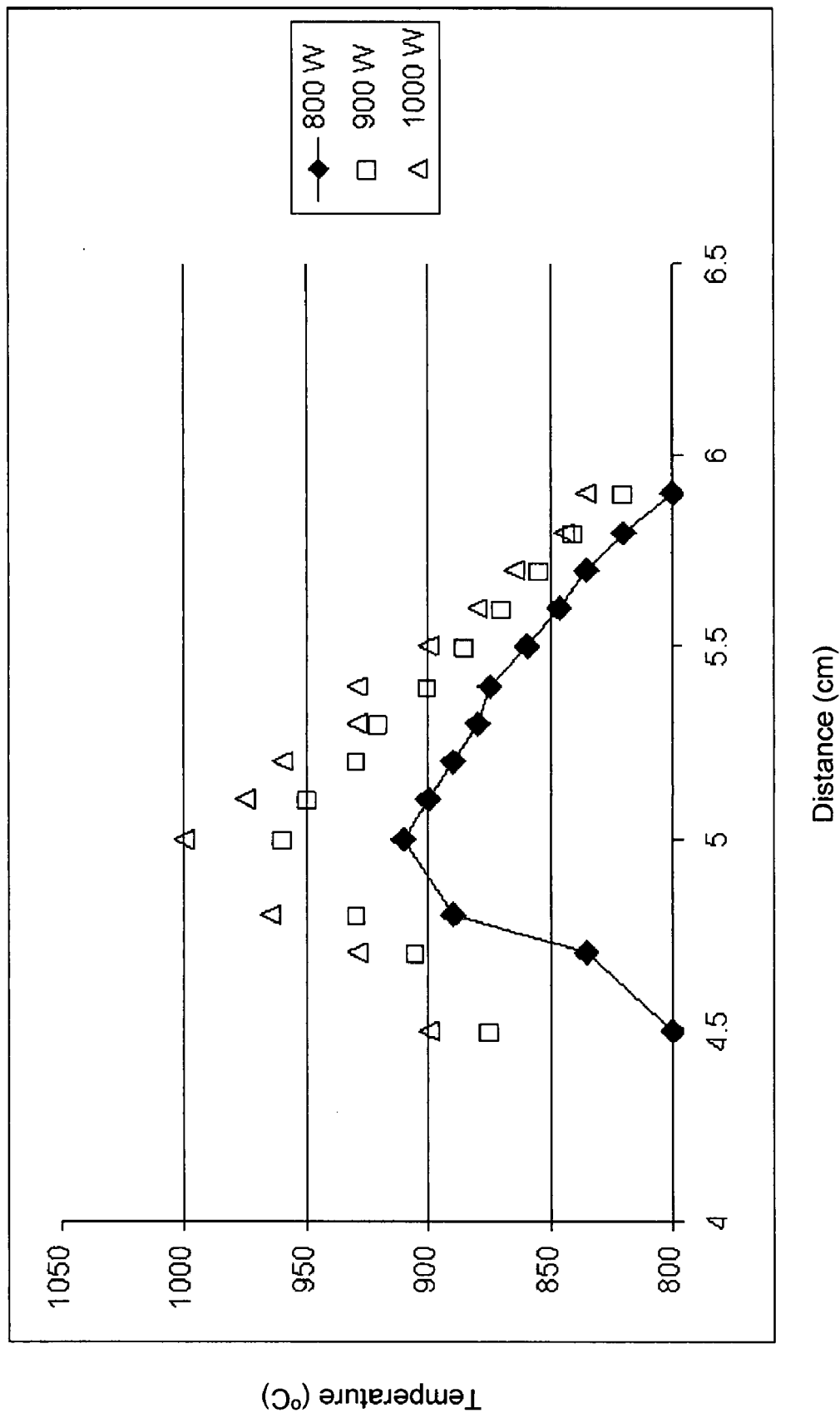
FIG. 6 is a graph illustrating variation in the temperature of a diamond seed as a function of the distance between two metal discs, in accordance with an embodiment of the invention.

FIG. 6 is a graph illustrating variation in the temperature of diamond seed 404 as a function of the distance between metal discs 408 and 410, in accordance with an embodiment of the invention.

In accordance with an embodiment of the invention, a temperature in excess of 1000° C. can be generated by varying the distance between metal discs 408 and 410 and varying the microwave power from 800 to 1000 Watts. The temperature of diamond seed 404 is measured using a pyrometer. Pyrometer is a non-contact temperature measuring device. The efficiency in such an arrangement is approximately 1° C./W. The efficiency is measured as temperature produced per unit of microwave power at the surface of the diamond seed. In accordance with an embodiment of the invention, growth rates of diamond seed greater than 1 micron per hour can be achieved at a low power. The movement of metal discs 408 and 410 also results in the movement of the position of the plasma vertically. This leads to a variance in the temperature on the surface of diamond seed 404. As a result, diamond seed 404 can attain different temperature by moving the plasma up and down.

Figure 7:
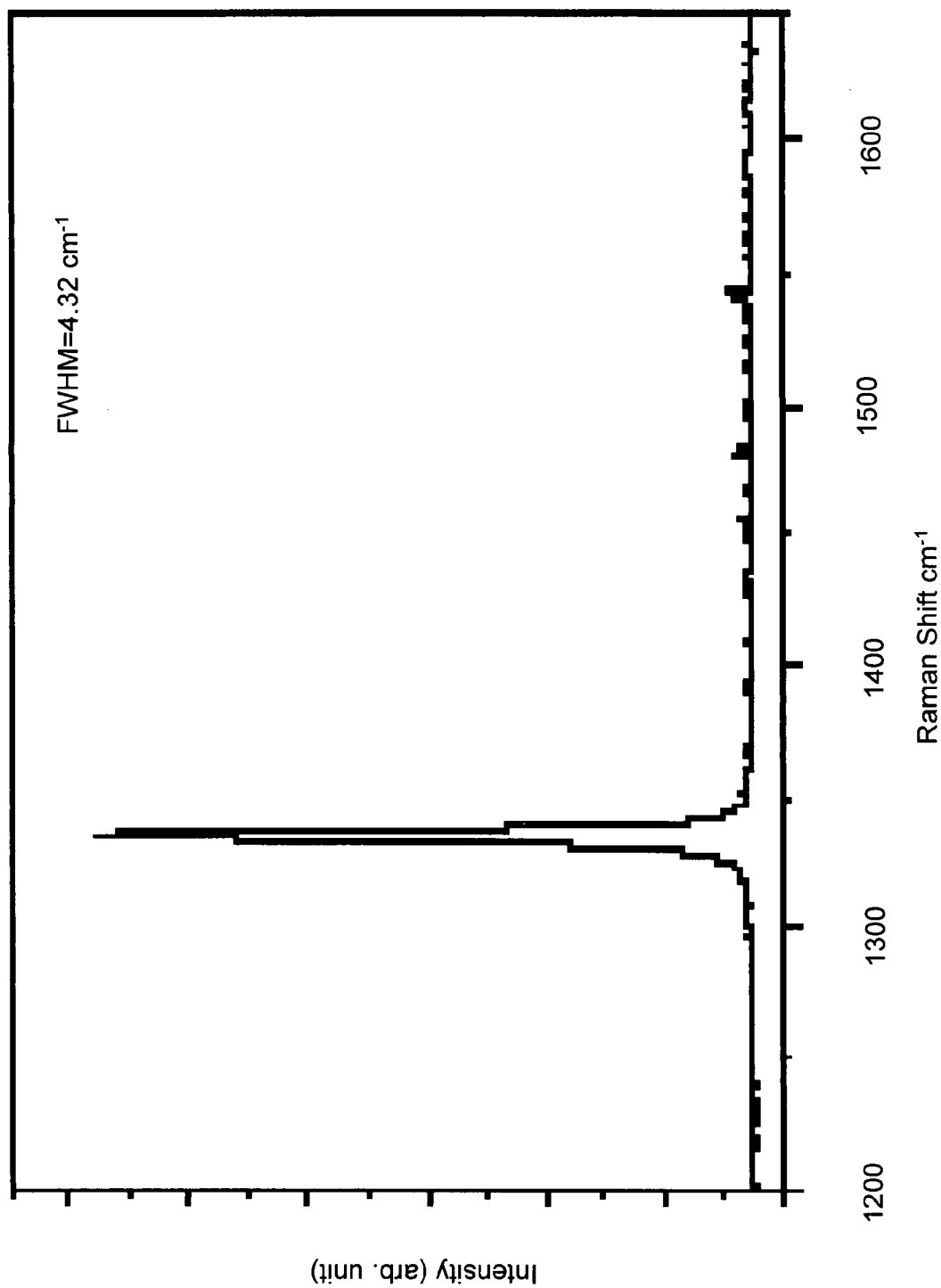
FIG. 7 is a graph illustrating Raman spectra of a single crystalline diamond, in accordance with an embodiment of the invention.

FIG. 7 is a graph illustrating Raman spectra of a single crystalline diamond, in accordance with an embodiment of the invention. After carrying out the deposition process for 10 hours, the diamond seed is removed from the substrate holder and is subjected to a variety of characterization studies. The characterization studies include Raman spectroscopy, X-ray diffraction and thermal conductivity measurements.

A typical Raman spectra of a sample of the single crystalline diamond produced in accordance with the method of the present invention is shown in FIG. 7. A strong peak at 1332 $cm^{-1}$ indicates the synthesis of a single crystalline diamond. The Full-Width-at-Half-Maximum (FWHM) of the peak is 4.32 $cm^{-1}$, which indicates that the quality of the sample is high.

It will be evident to a person of ordinary skill in the art that one or more of the embodiments mentioned above provide the following advantages for producing single crystalline diamonds using MPCVD process. The method of the invention enables generating high temperature on the surface of the one or more diamond seeds at a low microwave power. Further, the method of the present invention provides constant growth conditions at the surface of the one or more diamond seeds by manipulating the position of the plasma, while producing one or more single crystalline diamonds. Furthermore, the method of the present invention provides high growth rates for producing single crystalline diamonds.

While the preferred embodiments of the invention have been illustrated and described, it will be clear that the invention is not limited to these embodiments only. Numerous modifications, changes, variations, substitutions and equivalents will be apparent to those skilled in the art without departing from the spirit and scope of the invention as described in the claims.

What is claimed is:

1. A method for producing one or more single crystalline diamonds, the method comprising the steps of:
    a. placing one or more diamond seeds in a substrate holder in a chemical vapor deposition chamber;
    b. placing one or more metal discs in the chemical vapor deposition chamber in the same horizontal plane as the substrate holder;
    c. providing a diamond forming gas adjacent to the one or more diamond seeds;
    d. generating plasma from the diamond forming gas by exposing the diamond forming gas to microwave radiation, wherein the position of said one or more metal discs generates a high temperature at the one or more diamond seeds at an efficiency of approximately 1° C./Watt of microwave power; and
    e. exposing the one or more diamond seeds to the plasma under conditions to form the one or more single crystalline diamonds.

2. The method of claim 1 further comprising the step of manipulating the position of the plasma to provide constant growth conditions at the growth surface of the one or more diamond seeds.

3. The method of claim 2, wherein the step of manipulating the position of the plasma further comprises the steps of:
    a. placing one or more metal plates at the top of the chemical vapor deposition chamber if a microwave antenna is at the bottom; and
    b. moving the one or more metal plates up or down slowly to provide upward or downward movement of the plasma.

4. The method of claim 2, wherein the step of manipulating the position of the plasma further comprises the steps of:
    a. placing two curved metal plates on either side of the substrate holder if the microwave energy is fed at the top; and
    b. moving the two curved metal plates inward or outward to provide upward or downward movement of the plasma.

5. The method of claim 1, wherein the step of placing the one or more metal discs comprises the step of moving the one or more metal discs using external means to achieve the required temperature of the one or more diamond seeds.

6. The method of claim 1 further comprising the step of monitoring the temperature of the one or more diamond seeds by using a pyrometer.

7. The method of claim 1 further comprising the step of maintaining microwave power and pressure during the growth of the one or more single crystalline diamonds.

8. The method of claim 1, wherein the one or more diamond seeds are selected from the group consisting of HPHT grown synthetic diamond, CVD grown synthetic diamond and natural diamond.

9. The method of claim 1, wherein the substrate holder is made of Molybdenum.

10. The method of claim 1, wherein the one or more metal discs are four.

11. The method of claim 1, wherein the one or more metal discs are two.

12. The method of claim 1, wherein the one or more diamond seeds are maintained at a temperature ranging from 800° C. to 1600° C.

13. The method of claim 1, wherein the chemical vapor deposition chamber is maintained at a pressure ranging from 90 to 300 torr.

14. The method of claim 1, wherein the diamond forming gas includes methane and hydrogen, wherein the methane is 4% to 24% of the hydrogen.

15. The method of claim 1, wherein a growth rate of the one or more single crystalline diamonds is 1 to 150 micrometer per hour.

* * * * *